United States Patent [19]

Honda et al.

[11] Patent Number: 5,053,936
[45] Date of Patent: Oct. 1, 1991

[54] FREQUENCY/VOLTAGE CONVERTING DEVICE

[75] Inventors: Jun Honda; Hiroyuki Kubozoe, both of Ohta, Japan

[73] Assignee: Pioneer Electronic Corportion, Tokyo, Japan

[21] Appl. No.: 538,444

[22] Filed: Jun. 15, 1990

[30] Foreign Application Priority Data

Jun. 21, 1989 [JP] Japan ............................. 1-71660[U]

[51] Int. Cl.$^5$ ............................................. H02M 7/00
[52] U.S. Cl. .......................................... 363/8; 363/65
[58] Field of Search .............. 363/8, 65, 71; 328/140, 328/141; 307/260, 261, 271

[56] References Cited

U.S. PATENT DOCUMENTS 4,024,443  5/1977  Schmucker et al. ................. 318/175
4,222,095  9/1980  Stein .......................................... 363/8
4,556,937  12/1985  Ziogas et al. ............................ 363/8

Primary Examiner—Peter S. Wong
Attorney, Agent, or Firm—Sughrue, Mion, Zinn, Macpeak & Seas

[57] ABSTRACT

A frequency/voltage converting device includes a frequency/voltage converting means for converting a DC voltage corresponding to the frequency of an input signal, a reverse-polarity ripple voltage outputting device for outputting a ripple voltage which is equal in magnitude and reverse in polarity to a ripple voltage contained in the DC voltage output from the frequency/voltage converting means; and an adding device for adding the DC voltage output from the frequency/voltage converting device and the voltage output from the reverse-polarity ripple voltage outputting device. The above arrangement serves to cancel the ripple voltage, thereby obtaining a DC voltage containing no ripple voltage for a sawtooth wave generating device.

5 Claims, 3 Drawing Sheets

FREQUENCY/VOLTAGE CONVERTING DEVICE

BACKGROUND OF THE INVENTION

1. Field of the Invention

The present invention relates generally to a frequency/voltage converting device and, more particularly, to a frequency/voltage converting device which is suitable for use in generating a DC voltage corresponding to the desired frequency from an input signal containing pulse trains of different frequencies.

2. Description of the Related Art

The standard television system adopted in Japan is the NTSC system in which a luminance signal (Y signal), similar to the signal used in an ordinary monochrome television system, is employed to represent the brightness of an image, while a subcarrier of approximately 3.58 MHz is used to transmit two chrominance signals for carrying colors. A composite video signal based on the NTSC system has a 21-H vertical blanking period (interval) which includes a first equalizing interval train of a 3-H period, a vertical synchronizing pulse interval of a 3-H period, a second equalizing pulse interval of a 3-H period, and a horizontal synchronizing pulse interval of a 12-H period. The term "H" used herein indicates the time period which elapses between the leading end of a particular scanning line and the leading end of the next scanning line (1/horizontal synchronizing frequency).

Referring to the operation of horizontal deflection in a television picture tube, an electron beam is oscillated horizontally by supplying a regular sawtooth current to deflection coils, thereby forming a regular raster. In general, the regular sawtooth current is generated in the following manner: A horizontal synchronizing pulse is converted into a DC voltage corresponding to its frequency (hereinafter referred to as a "F/V conversion") and the aforesaid sawtooth current is generated on the basis of the DC voltage. For this reason, it is necessary that the DC voltage be an accurate DC voltage containing no ripple voltage.

In such a television receiver, a F/V converting apparatus for use in effecting the F/V conversion includes a monostable multivibrator (hereinafter referred to as a "MM") whose input terminal is connected to an input terminal. The horizontal synchronizing pulses contained in a composite video signal are provided at the input terminal IN. Connected to the control part mounting terminal of the MM are a resistor and a capacitor, both of which cooperate to determine the width of an output pulse. A resistor, which constitutes a low-pass filter, is connected at one end to the output terminal of the MM. The other terminal of the resistor is connected to both an output terminal and one end of a capacitor. The other end of the capacitor is grounded.

The F/V converting device is arranged so that, if only the horizontal synchronizing pulse of a 1-H period is supplied to the input terminal, the MM outputs a pulse of a pulse width corresponding to the time constant determined by the resistor and the capacitor. The output pulse is smoothened by the low-pass filter and provided at the output terminal as a constant DC voltage containing no ripple voltage.

However, the DC voltage which is in practice provided at the output terminal has an output waveform including ripple voltages. This is because the composite video signal includes, adjacent to the horizontal synchronizing pulse interval containing pulses of a pulse width of 1 H, the equalizing pulse interval, the vertical synchronizing pulse interval and the further equalizing pulse interval, each of which interval contains pulses of a ½-H pulse width. More specifically, the magnitude of a DC voltage corresponding to the 1-H horizontal synchronizing pulse is +V, while an output voltage corresponding to the ½-H equalizing pulse is provided as a ripple voltage higher than +V. If a sawtooth current generated on the basis of the output voltage containing such ripple voltage is supplied to the deflection coils, regular horizontal deflection will be impossible. To achieve the regular horizontal deflection, for example, the time constant of the low-pass filter may be made large. However, the increase of the time constant may lead to the problem that the output voltage increases or that transient response characteristics deteriorates at the time of frequency switching in multi-scan operation or the like.

SUMMARY OF THE INVENTION

It is, therefore, an object of the present invention to provide a frequency/voltage converting device capable of outputting a stable DC voltage containing no ripple voltage when effecting F/V conversion based on, for example, horizontal synchronizing pulses contained in a composite video signal of a standard television system.

To achieve the above object, according to the present invention, there is provided a frequency/voltage converting device which comprises: frequency/voltage converting means for outputting a DC voltage corresponding to the frequency of an input signal; reverse-polarity ripple voltage outputting means for outputting a ripple voltage which is equal in magnitude and reverse in polarity to a ripple voltage contained in the DC voltage output from the frequency/voltage converting device; and adding means for adding the DC voltage output from the frequency/voltage converting device to the voltage output from the reverse-polarity ripple voltage outputting device.

In accordance with the present invention, the ripple voltage contained in the DC voltage generated by the frequency/voltage means and the reverse-polarity ripple voltage generated by the reverse-polarity voltage outputting means are equal in magnitude and reverse in polarity to each other. The ripple voltage and the reverse-polarity ripple voltage are added in the adding means to cancel each other. Accordingly, a regular DC voltage containing no ripple voltage is supplied.

Further objects, features and advantages of the present invention will become apparent from the following detailed description of an embodiment of the present invention with reference to the accompanying drawings.

DETAILED DESCRIPTION OF THE DRAWINGS

DESCRIPTION OF THE PREFERRED EMBODIMENT

As conductive to a full understanding of the nature and utility of the present invention, a brief consideration of a conventional frequency/voltage converting device will be first presented below with reference to FIGS. 4 to 6 principally for the purpose of comparison therebetween.

Figure 4:
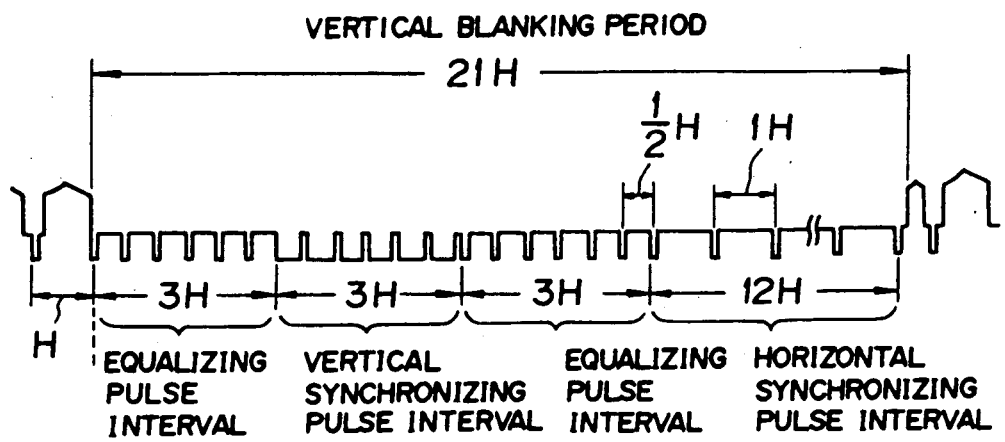
FIG. 4 is a schematic diagram showing the pulse waveform used in a standard television system.

The NTSC system is the standard television system adopted in, for example, Japan, and a part of a composite video signal based on the NTSC system is shown in FIG. 4. Referring to FIG. 4, the composite video signal has a 21-H vertical blanking period which includes a first equalizing pulse interval of a 3-H period, a vertical synchronizing pulse interval of a 3-H period, a second equalizing pulse interval of a 3-H period, and a horizontal synchronizing pulse interval of a 12-H period.

Figure 5:
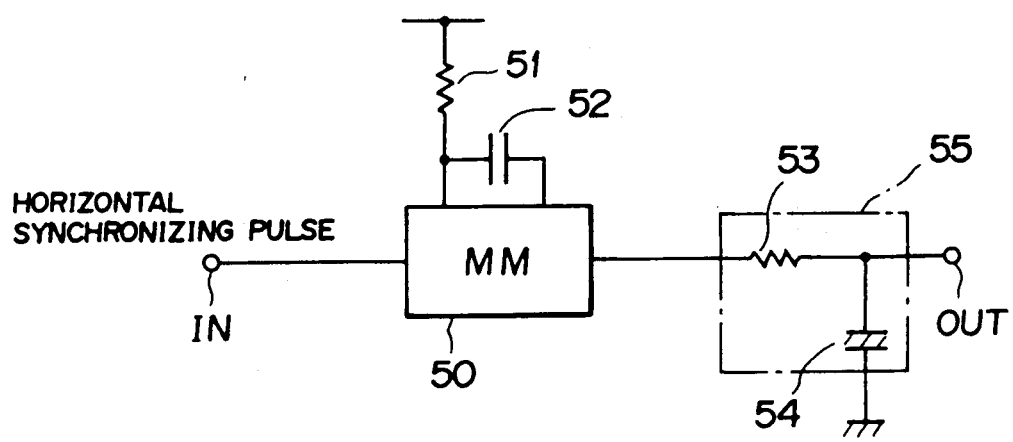
FIG. 5 is a block diagram showing a conventional type of frequency/voltage converting device.

FIG. 5 shows one example of an F/V converting device of the conventional type which is used in effecting F/V conversion in a television receiver. As shown in FIG. 5, an input terminal IN is connected to a monostable multivibrator (hereinafter referred to as an "MM") 50, and the horizontal synchronizing pulses contained in the composite video signal are provided at the input terminal IN. Connected to the control part mounting terminal of the MM 50 are a resistor 51 and a capacitor 52, both of which cooperate to determine the width of an output pulse. A resistor 53, which constitutes a low-pass filter 55, is connected at one end to the output terminal of the MM 50. The other terminal of the resistor 53 is connected to both an output terminal OUT and one end of a capacitor 54. The other end of the capacitor 54 is grounded.

The F/V converting device is arranged so that, if only the horizontal synchronizing pulse of a 1-H period, shown on the right-hand side of FIG. 4, is supplied to the input terminal IN, the MM 50 outputs a pulse of a pulse width corresponding to the time constant determined by the resistor 51 and the capacitor 52. The output pulse is smoothened by the low-pass filter 55 and provided at the output terminal OUT as a constant DC voltage containing no ripple voltages.

Figure 6:
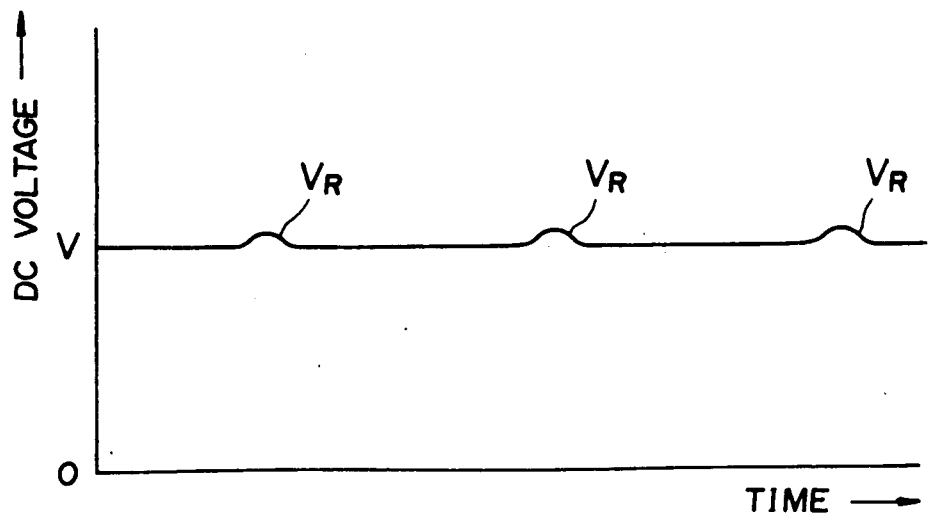
FIG. 6 is a diagram showing the output waveform of the conventional type of frequency/voltage converting device.

However, as shown in FIG. 6, the DC voltage which is in practice provided at the output terminal OUT has an output waveform including ripple voltages $V_R$.

An embodiment of the present invention which can solves the above-described disadvantage will now be explained below with reference to the accompanying drawings.

Figure 1:
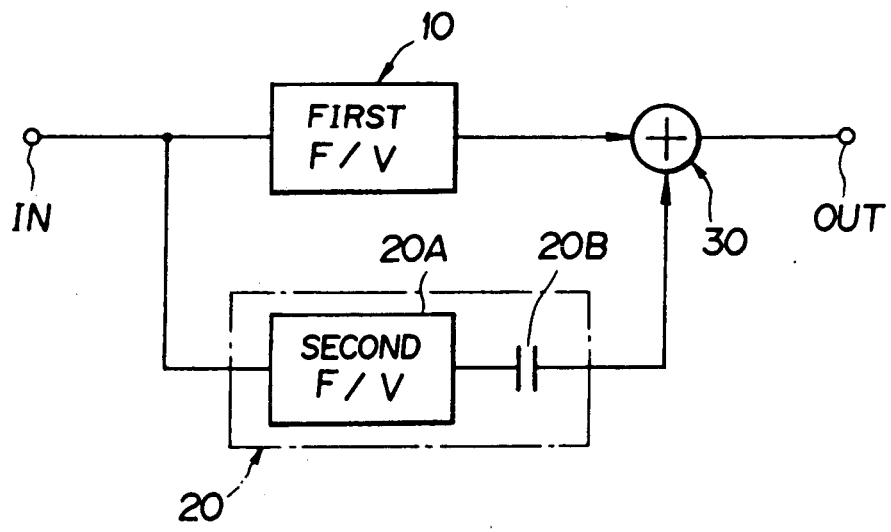
FIG. 1 is a block diagram showing the construction of an embodiment of the present invention.
Figure 2:
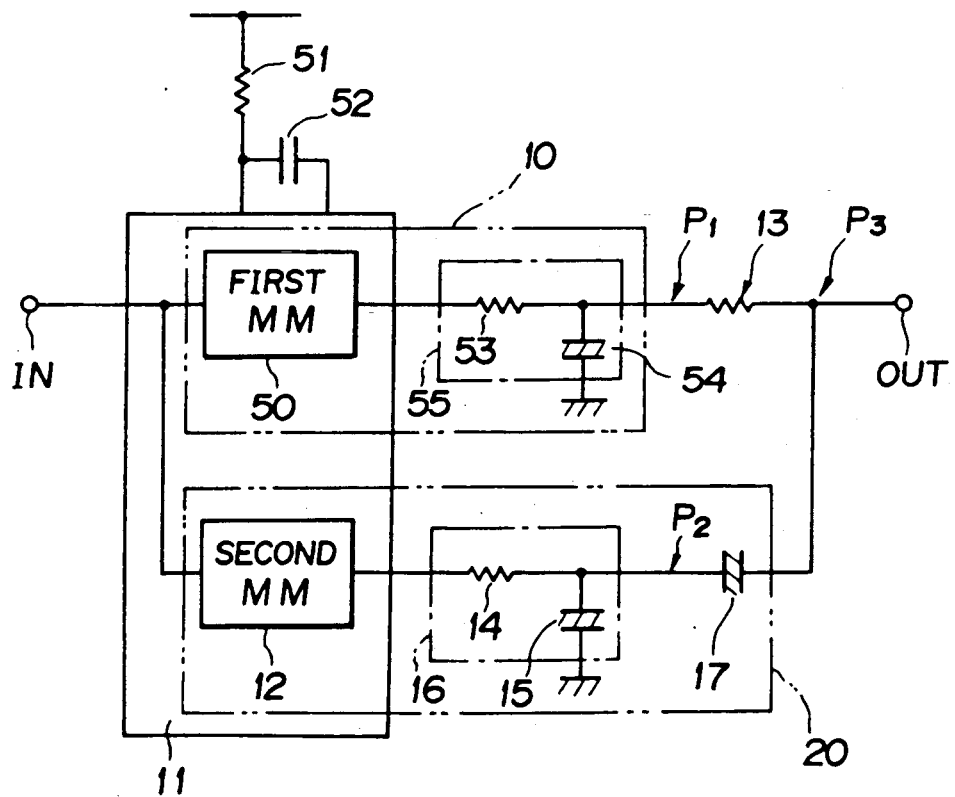
FIG. 2 is an electrical circuit diagram showing the embodiment of the present invention.

FIG. 1 is a block diagram showing the construction of a frequency/voltage converting device according to the embodiment of the present invention, and FIG. 2 is a circuit diagram showing a specific form of circuit in the embodiment of the present invention.

The frequency/voltage converting device shown in FIG. 1 comprises frequency/voltage converting means 10 utilizing a first F/V converter, reverse-polarity ripple voltage outputting means 20 made up of a second F/V converter 20A and a DC-component eliminating capacitor 20B, and adding means 30 utilizing an adder.

The input terminal IN is connected to both the input terminal of the frequency/voltage converting means 10 and the input terminal of the reverse-polarity ripple voltage outputting means 20. The reverse-polarity ripple voltage outputting means 20 is arranged to provide a ripple voltage output having a waveform which is equal in magnitude and reverse in polarity to the ripple voltage waveform contained in the output voltage from the frequency/voltage converting means 10. The output terminal of the frequency/voltage converting means 10 is connected to one input terminal of the adding means 30. The output terminal of the reverse-polarity voltage outputting means 20 is connected to the other input terminal of the adding means 30, which is connected to the output terminal OUT.

In the above arrangement, the ripple voltage contained in the output voltage from the frequency/voltage converting means 10 and the reverse-polarity ripple voltage output from the reverse-polarity ripple voltage outputting means 20 are added in the adding means 30. In consequence, the ripple voltage and the reverse-polarity ripple voltage cancel each other and a DC voltage containing no ripple voltage is provided at the output terminal OUT.

The above-described arrangement is shown in FIG. 2 as a specific electrical circuit.

As shown in FIG. 2, the illustrated circuit is constructed including the reverse-polarity ripple voltage outputting means 20.

In FIG. 2, a two-stage parallel monostable multivibrator (MM) 11 includes the first MM 50 and a second MM 12. The resistor 51 and the capacitor 52 are connected to the control part mounting terminal of the MM 11 so that a time constant common to the first MM 50 and the second MM 12 is determined. The input terminal IN is connected to each of the input terminals of the first MM 50 and the second MM 12. The second MM 12 outputs a pulse voltage which is equal in magnitude and reverse in polarity to the pulse voltage output from the first MM 50. The output terminal of the first MM 50 is connected to one end of a resistor 13 via the low-pass filter 55. The other end of the resistor 13 is connected to both the output terminal OUT and one end of a capacitor 17. The output terminal of the second MM 12 is connected to one end of a resistor 14 which constitutes a low-pass filter 16. The other end of the resistor 14 is grounded via a capacitor 15 and is connected to the other end of the capacitor 17.

The operation of the frequency/voltage converting device will now be explained below.

Figure 3A:
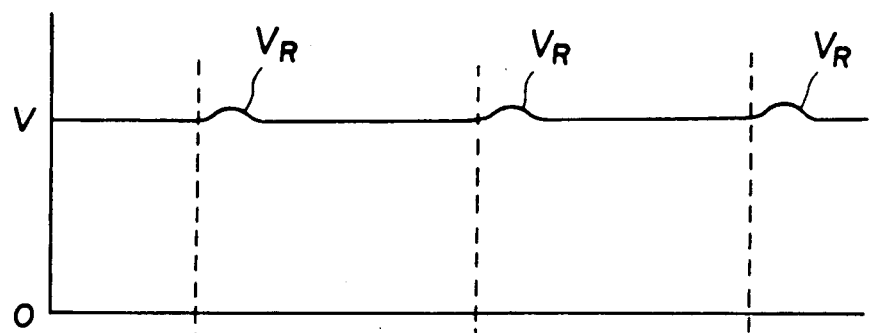
FIGS. 3A to 3C are waveform diagrams showing the operation of the embodiment of the present invention.
Figure 3B:
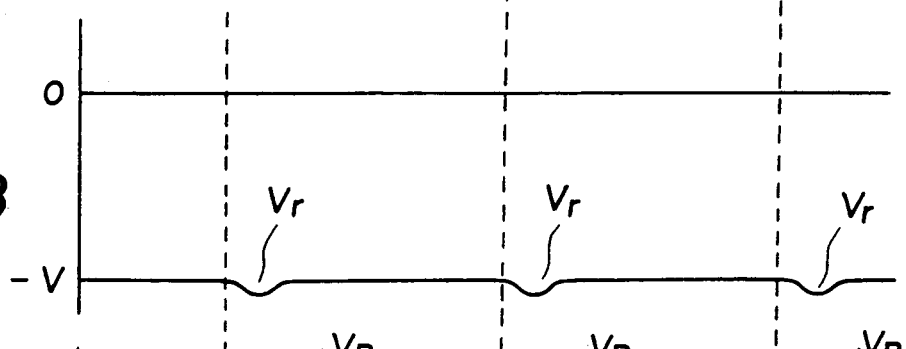
Figure 3C:
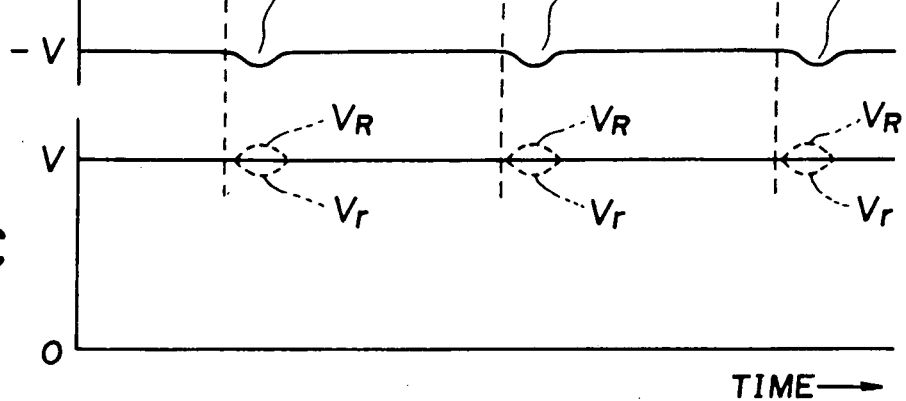

FIG. 3 is a waveform diagram which serves to illustrate the operation of the present embodiment.

The horizontal synchronizing pulses shown in FIG. 4 are supplied to the input terminal IN and the equalizing pulses are supplied to the same prior to the horizontal synchronizing pulses. FIG. 3 (A) shows an output waveform which is provided at the location shown at $P_1$ by the frequency/voltage converting means 10. The waveform of part (A) of FIG. 3 (A) is the same as that shown in FIG. 6. The aforesaid horizontal synchronizing pulses and the equalizing pulses are also supplied to the second MM 12, which in turn outputs a pulse voltage of pulse width determined by the timing constant circuit. This pulse voltage is smoothened by the low-pass filter 16. An output waveform which is provided at the location shown at $P_2$ is as shown in FIG. 3 (B). More specifically, a DC voltage $-V$ is output in correspondence with the horizontal synchronizing pulse, while ripple voltages $V_r$ are output, each of which is equal in magnitude and reverse in polarity to the aforesaid ripple voltage $V_R$ in correspondence with the equalizing pulses. The capacitor 17 cuts DC components from the output waveform provided at the location $P_2$. Then, the ripples $V_R$ and $V_r$ are added at the location shown at $P_3$ in FIG. 2, thereby providing a DC voltage containing no ripple voltage as shown FIG. 3 (C).

The MM 11 is constructed including a signal monostable multivibrator and supplies outputs to the positive and negative sides to the corresponding low-pass filters 55 and 16.

The above embodiment has been explained with reference to the example in which the DC voltage corresponding to the horizontal synchronizing pulse in the standard television system is generated, but the range of applications of the present invention is not limited to such an example. For example, the present invention can be applied to an arrangement which receives an input signal containing pulse trains of different frequencies to produce a DC voltage corresponding to the desired frequency but containing no ripple voltage.

As is apparent from the foregoing, according to the present invention, there is provided a frequency/voltage converting device which is arranged to produce ripple voltages which are equal in magnitude and reverse in polarity to the ripple voltages contained in the output from a frequency/voltage converter. Accordingly, the ripple voltages and the reverse-polarity ripple voltages can be added to cancel the ripple voltages themselves, whereby a DC voltage containing no ripple component can be supplied.

What is claimed is:

1. A frequency/voltage converting device comprising:
    frequency/voltage converting means for outputting a DC voltage corresponding to the frequency of an input signal;
    reverse-polarity ripple voltage outputting means for outputting a ripple voltage which is equal in magnitude and reverse in polarity to a ripple voltage contained in the DC voltage output from said frequency/voltage converting means; and
    adding means for adding said DC voltage output from said frequency/voltage converting means to said voltage output from said reverse-polarity ripple voltage outputting means.

2. A frequency/voltage converting device according to claim 1, wherein said reverse-polarity voltage outputting means comprises: a second frequency/voltage converting means for outputting a DC voltage which is equal in magnitude and reverse in polarity to the DC voltage output from said frequency/voltage voltage converting means; and a DC eliminating capacitor for eliminating the DC component of said DC voltage output from said second frequency/voltage converting means.

3. A frequency/voltage converting device according to claim 1, wherein said frequency/voltage converting means and said reverse-polarity voltage outputting means each comprises a monostable multivibrator.

4. A frequency/voltage converting device according to claim 3, wherein said frequency/voltage converting means and said reverse-polarity voltage outputting means each comprises of a low-pass filter connected to said monostable multivibrator.

5. A frequency/voltage converting device according to claim 1, wherein said frequency/voltage and said reverse-polarity ripple voltage outputting means are connected in parallel, time-constant determining means being connected in common so that it determines the time constant of said frequency/voltage and said reverse-polarity ripple voltage outputting means.

* * * * *